United States Patent [19]

Gulla et al.

[11] Patent Number: 4,551,409

[45] Date of Patent: Nov. 5, 1985

[54] PHOTORESIST COMPOSITION OF COCONDENSED NAPHTHOL AND PHENOL WITH FORMALDEHYDE IN ADMIXTURE WITH POSITIVE O-QUINONE DIAZIDE OR NEGATIVE AZIDE

[75] Inventors: Michael Gulla, Sherborn; Paul Taylor, North Andover; Michael J. Oddi, Burlington, all of Mass.

[73] Assignee: Shipley Company Inc., Newton, Mass.

[21] Appl. No.: 549,286

[22] Filed: Nov. 7, 1983

[51] Int. Cl.⁴ .................. G03C 1/60; G03C 1/71; G03F 7/26
[52] U.S. Cl. .................. 430/192; 430/165; 430/167; 430/197; 430/325; 430/326
[58] Field of Search .............. 430/165, 167, 192, 193, 430/197, 325, 326

[56] References Cited

U.S. PATENT DOCUMENTS

| | | | |
|---|---|---|---|
| 3,634,082 | 1/1972 | Christensen | 430/192 |
| 3,859,099 | 1/1975 | Petropoulos | 430/165 |
| 3,868,254 | 2/1975 | Wemmers | 430/191 |
| 3,869,292 | 3/1975 | Peters | 430/192 |
| 4,123,279 | 10/1978 | Kobayashi | 430/193 |
| 4,250,242 | 2/1981 | Doering | 430/141 |
| 4,404,357 | 9/1983 | Taylor et al. | 528/153 |

FOREIGN PATENT DOCUMENTS 2079481 1/1982 United Kingdom ............... 430/197

*Primary Examiner*—Charles L. Bowers, Jr.
*Attorney, Agent, or Firm*—Robert L. Goldberg

[57] ABSTRACT

A photoresist composition comprising a sensitizer in a binder that is a naphthol polymer alone or mixed with another compatible resin such as a novolak resin or a polyvinyl phenol. The use of the naphthol resin as a portion of the binder increases the heat distortion temperature of the photoresist composition.

22 Claims, No Drawings

PHOTORESIST COMPOSITION OF COCONDENSED NAPHTHOL AND PHENOL WITH FORMALDEHYDE IN ADMIXTURE WITH POSITIVE O-QUINONE DIAZIDE OR NEGATIVE AZIDE

BACKGROUND OF THE INVENTION

1. Introduction

This invention relates to a photoresist composition comprising a light sensitive compound in a binder containing repeating units derived from naphthol.

2. Description of the Prior Art

Photoresist compositions are well known in the art and described in numerous publications including DeForest, *Photoresist Materials and Processes*, McGraw-Hill Book Company, New York, 1975. Photoresists comprise coatings produced from solution or applied as a dry film which, when exposed to light of the proper wave length, are chemically altered in their solubility to certain solvents (developers). Two types are known. The negative acting resist is initially a mixture which is soluble in its developer, but following exposure to activating radiation, becomes insoluble in developer thereby defining a latent image. Positive-acting resists work in the opposite fashion, light exposure making the resist soluble in developer.

Positive working photoresists are more expensive than negative working photoresists but are capable of providing superior image resolution. For example, the positive working photoresist described above can be developed to yield relief images with a line width as low as one micron or less. In addition, considering the cross-section of a photoresist image, the channels formed in the resist by development have square corners and side walls with only minimal taper.

The positive-working resists comprise a light sensitive compound in a film-forming polymer binder. The light sensitive compounds, or sensitizers as they are often called, most frequently used are esters and amides formed from o-quinone diazide sulfonic and carboxylic acids. These esters and amides are well known in the art and are described by DeForest, supra, pages 47–55, incorporated herein by reference. These light sensitive compounds, and the methods used to make the same, are all well documented in prior patents including German Pat. No. 865,140 granted Feb. 2, 1953 and U.S. Pat. Nos. 2,767,092; 3,046,110; 3,046,112; 3,046,119; 3,046,121; 3,046,122 and 3,106,465, all incorporated herein by reference. Additional sulfonic amide sensitizers that have been used in the formulation of positive-acting photoresists are shown in U.S. Pat. No. 3,637,384, also incorporated herein by reference. These materials are formed by the reaction of a suitable diazide of an aromatic sulfonyl chloride with an appropriate resin amine. Methods for the manufacture of these sensitizers and examples of the same are shown in U.S. Pat. No. 2,797,213 incorporated herein by reference. Other positive-working diazo compounds have been used for specific purposes. For example, a diazo compound used as a positive-working photoresist for deep U.V. lithography is Meldrum's diazo and its analogs as described by Clecak et al., *Technical Disclosure Bulletin*, Volume 24, Number 4, September 1981, IBM Corporation, pp. 1907 and 1908. An o-quinone diazide compound suitable for laser imaging is shown in U.S. Pat. No. 4,207,107. The aforesaid references are also incorporated herein by reference.

A class of negative resists comprising a negative acting sensitizer in a polymer binder is described by Iwayanagi et al., *IEEE Transactions on Electron Devices*, Vol. ED-28, No. 11, November, 1981, incorporated herein by reference. The resists of this reference comprise an aromatic azide in a phenolic binder. It is believed that these resists are first disclosed and claimed in U.S. Pat. No. 3,869,292, also incorporated herein by referenc. Additional aromatic azide sensitizers are disclosed by DeForest, supra, and U.S. Pat. Nos. 2,940,853 and 2,852,379, incorporated herein by reference.

The resin binders most frequently used with the o-quinone diazides in commerical practice are the alkali soluble phenol formaldehyde resins known as the Novolak resins. Photoresists using such polymers are illustrated in U.K. Pat. No. 1,110,017 incorporated herein by reference. These materials are the product of reaction of a phenol with formaldehyde under conditions whereby a thermoplastic polymer is formed with a melting point of about 120° C. Novolaks with melting points well in excess of 120° C. are known but are not generally used in photoresist formulations because they are often brittle or have other properties limiting their use.

Another class of binders used with both the negative acting aromatic azides and the positive acting o-quinone diazides are the homopolymers and copolymers of vinyl phenol. Photoresists of this nature are disclosed in U.S. Pat. No. 3,869,292, supra. It is believed that photoresists using binders of polymers formed from vinyl phenols have not found extensive use in commerce.

In the prior art, the above described positive resists using novolak resins as a binder are most often used as masks to protect substrates from chemical etching in photo-engraving processes. For example, in a conventional process for the manufacture of a printed circuit board, a copper-clad substrate is coated with a layer of a positive working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate and for high density circuits, must be capable of fine line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by the development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer and must be capable of very fine line image resolution.

Recent developments in photoresist technology involve processes where high temperatures are encountered. For example, a recent development in the fabrication of semiconductors substitutes dry plasma etching for wet chemical etching to define a circuit. Plasma etching provides advantages over wet chemical etching in that it offers process simplification and improves dimensional resolution and tolerance. However, the demands on the resist are significantly greater when using plasma etching. For both wet etching, and plasma etching the resist must adhere to the substrate and must be capable of fine line image resolution. For plasma etching, in addition to these properties, the resist must often be capable of withstanding high temperatures without image deformation and without eroding as plasma etching generates high temperatures at the wafer surface.

The above described prior art positive working resists provide good resistance to chemical etchants and fine line image resolution. However, they soften and begin to flow at temperatures somewhat in excess of about 120° C. This can result in image distortion and poorer image resolution.

SUMMARY OF THE INVENTION

The subject invention is directed to photoresist compositions useful for the same purposes as prior art photoresists, but also useful for purposes where resistance to temperatures in excess of 120° C. are required. The photoresist may be a positive acting or a negative acting photoresist, dependent upon the selection of the sensitizer, and comprises a sensitizer such as a diazo compound or an azide compound in an alkali soluble polymer binder containing repeating units derived from naphthol. The binder may be a homopolymer of a naphthol, a copolymer of naphthol and another aromatic alcohol, or a mixture of a polymer containing naphthol repeating units and another alkali soluble resin such as a novolak resin or a polyvinyl phenol. The inclusion of naphthol repeating units in the binder increases the high temperature resistance of the photoresist and resists able to withstand temperatures approaching 300° C. without image distortion are possible.

DESCRIPTION OF THE PREFERRED EMBODIMENTS

The following definitions are adopted to assist in the understanding of the description of the invention:

"Naphthol polymer" is defined as a homopolymer or copolymer resulting from the polymerization of naphthol alone or a mixture of aromatic alcohols where one member of the mixture is a naphthol.

"Naphthol blend" is defined as a blend of a naphthol polymer with another alkali soluble resin.

"Naphthol content" is defined as the molar concentration of repeating units in a naphthol polymer or naphthol blend derived from naphthol, as the context so requires.

Many of the naphthol polymers suitable for purposes of this invention are disclosed and claimed in commonly assigned U.S. Pat. No. 4,404,357 granted Sept. 13, 1983 and incorporated herein by reference. The naphthol polymers of said patent are acid catalyzed condensation products of a mixture of aromatic alcohols and an aldehyde. The aromatic alcohol mixture comprises a naphthol and a phenol where the concentration of the naphthol relative to the phenol can vary within wide limits, dependent upon the desired properties of the copolymer. Higher concentrations of the naphthol yield copolymers with higher melt temperatures. In general, polymers can be formed with the naphthol ranging from 5 to 100 mole percent of the aromatic alcohol with the phenol comprising the balance. The preferred concentration of the naphthol, for ease in the formation of the polymer, ranges between about 5 and 50 mole percent of the aromatic alcohol mixture.

Naphthol polymers are formed by condensing an aromatic alcohol, which for purposes of this invention may be a naphthol alone or a naphthol mixed with a phenol, with an aldehyde in the presence of a conventional acid catalyst. The concentration of the aromatic alcohol is slightly in excess of the aldehyde and preferably, the molar ratio of the alcohol to the aldehyde is about 1 to 0.9. The polymers are formed by mixing the reactants in a reactor and refluxing the mixture at an elevated temperature for a period of time to form a polymer or copolymer of suitable molecular weight. In this respect, the polymers typically have a molecular weight ranging between about 500 and 10,000.

The naphthol used in accordance with the invention conforms to the following general formula:

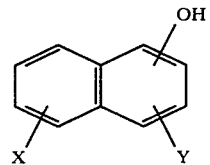

where X and Y are each members selected from the group of hydrogen, lower alkyl having from 1 to 4 carbon atoms, halogen, hydroxyl or carboxyl. Preferably, each of X and Y is hydrogen. The hydroxyl group is in the 1 or 2 position, though the 1-naphthols are preferred as the reaction proceeds with greater ease yielding higher molecular weight polymers. The 2-naphthols may gel if the reaction is not carefully controlled.

If a phenol is used in combination with the naphthol, those phenols known to be useful in the formation of a novolak resin may be combined with the naphthol. Such materials include, by way of illustratation only, phenol itself, m-cresol, o-cresol, p-cresol, 2,4-xylenol, 2,5-xylenol, 3,4-xylenol, 3,5-xylenol, thymol, carbacrol, p-phenylphenol and p-tert-butylphenol. The phenol can also comprise a mixture of phenols.

The catalyst used to effect the condensation reaction may be selected from among the mineral acids or organic carboxylic acids known to be useful for the formation of novolak resins. Typical catalysts for this purpose are oxalic acid, hydrochloric acid, p-toluene sulfonic acid and the like. Oxalic acid is preferred. The amount of catalyst employed may range from 0.5 to 5%, by weight, based upon the weight of the total aromatic compounds present in the composition.

Condensation of the aromatic alcohol mixture with the aldehyde may be effected in any conventional condensation apparatus such as a reactor equipped with an agitator, means for reflux and distillation and conventional heat-transfer means. In general, a preferred method for carrying out the condensation reaction is to add the condensation agent (the aldehyde) to the mixture of the aromatic alcohols containing the acid catalyst. The resultant mixture is agitated and heated to reflux over a time period ranging from about 2 to 24 hours during which the aromatic alcohol and the aldehyde condense. The condensation reaction typically involves the formation of low molecular weight intermediates which initially form and then rearrange and combine with each other at a later stage. Following reflux, excess water is removed from the condensate and the residue vacuum distilled to complete the condensation reaction thereby removing excess monomer while gradually heating to a temperature ranging from 200° C. to 300° C. Finally, the resultant resin is cooled to room temperature after being removed from the reactor.

The following example sets forth a procedure for forming a copolymer of an aromatic alcohol mixture where one of the alcohols is naphthol.

EXAMPLE 1

A copolymer was prepared by reacting an aromatic alcohol mixture comprising 35.3 grams of m-cresol and 4.3 grams of 1-naphthol with 26.1 grams of 37% formaldehyde solution in the presence of 0.7 grams of oxalic acid. The componenrs were added to a reactor under a nitrogen purge, agitated, brought to reflux temperature and refluxed for a period of approximately 2.0 hours at a temperature averaging about 90° C. Following reflux, excess water was removed from the condensation product by distillation, and the condensate heated to a temperature of about 240° C. under vacuum distillation for about 2 additional hours to complete the condensation reaction and to remove unreacted monomers. The condensate was then removed from the reaction vessel and permitted to cool to room temperature. The polymer so formed had a melting point of about 150° C. and an average molecular weight of about 3,700. Approximately 10% of its repeating units were derived from napthol.

EXAMPLE 2

A second copolymer was prepared by reacting an aromatic alcohol mixture comprising 47.88 grams of m-cresol, 4.89 grams of 4-t-butyl phenol and 7.62 grams of 1-naphthol with 38.61 grams of formaldehyde in the presence of 1.00 gram of oxalic acid. The procedure of example 1 was followed though the time of reflux was increased to in excess of 4 hours and the time for vacuum distillation was increased to in excess of 3 hours.

EXAMPLE 3

A homopolymer of 1-naphthol is prepared by reacting 63.42 grams of 1-naphthol with 35.69 grams of formaldehyde in the presence of 0.89 grams of oxalic acid. The procedure of Example 1 was followed though reflux was for 5 hours at 200° C. and vacuum distillation was for 2 hours, also at 200° C.

The procedure for determining melt point for the resins of the above examples uses a "hot bench" or "hot bar" apparatus. The apparatus consists of a stainless steel bar heated at one end to produce a temperature gradient along the length of the bar. A movable thermocouple provides the temperature along any point on the bar. Melt temperature is determined by spreading powdered resin along the heated bar. The temperature considered the melt temperature is recorded at that point on the bar where a powder/melt interface forms.

Other examples of making copolymers of naphthol with other phenols can be found in above-identified U.S. Pat. No. 4,404,357.

In accordance with the subject invention, the naphthol polymers described above may be blended with other naphthol polymers and/or with conventional novolak resins which may be any of the novolak resins known to the art. Blends of naphthol polymers with novolak resins are disclosed in copending U.S. Pat. No. 4,424,315, assigned to the same assignee as the subject application and incorporated hereinby reference. The ratio of the naphthol polymer to the novolak resin can vary within wide limits and is, in part, dependent upon the desired napthol content in the final naphthol blend. This ratio can vary from about 1 to 99 mole percent of the blend of the two resins, dependent upon the desired properties of the blend and the desired thermal properties of the photoresist as will be discussed in greater detail below. To obtain a blend with a naphthol content of 25 mole percent, 25% of a homopolymer of naphthol may be blended with 75% of a novolak resin. Alternatively, 50 mole percent of a copolymer formed from equal parts of naphthol and a phenol can be blended with 50 mole percent of a novolak. Obviously, numerous other combinations are possible to achieve the desired 25%.

The method of forming a naphthol blend where one component of the blend is a novolak resin is conventional. The two resins, in finely divided powder form, are mixed with each other or alternatively, the resins may be dissolved in a common solvent and precipitated as an intimate mixture.

The following example represents a blend of resins in accordance with the invention.

EXAMPLE 3

A blend of the naphthol polymer of example 1 and a novolak resin that is the acid catalyzed condensation product of m- and p-cresol with formaldehyde is formed by physically mixing powders of the two using a small ball mill. The blend contained 13.5 grams of the Example 1 napthol resin and 3.4 grams of the novolak resin. This blend can be used for the formation of photoresits as will be discussed in greater detail below.

Following the above procedure of mixing resin powders, resin blends may be formed in the following ratios:

| Example 1 resin (grams) | Novolak Resin (grams) |
|---|---|
| 1 | 39 |
| 5 | 35 |
| 10 | 30 |
| 15 | 25 |
| 20 | 20 |
| 30 | 10 |
| 35 | 5 |
| 39 | 1 |

The binders of the invention can also comprise a mixture of the naphthol polymer with a vinyl phenol resin. The polyvinyl phenols are described in the aforesaid U.S. Pat. No. 3,869,292. These polymers may be homopolymers or copolymers of o-, m-, or p-vinyl phenols.

The vinyl phenols used to form the polymers may be non-substituted or may carry any of the various substituents that do not adversly affect the ability to develop exposed resists images. For example, such substituents may be alkoxy such as methoxy or ethoxy groups, alkyl groups such as methyl or propyl groups, carboxyl groups, hydroxyl groups, or halogen such as chlorine or bromine. The homopolymers of ortho and p-vinylphenols are particularly advantageous, but the vinylphenols may all be used in the form of other homopolymers or copolymers with one another, or of copolymers with other vinyl acrylic compounds such as styrene, acrylic acid, acrylic acid esters, methacrylic acid, and methacrylic acid esters. Those polymers having a weight average molecular weight of between 3,500 and 60,000 are useful, but polymers having a weight average molecular weight between 4,000 and 15,000 are preferred.

The polyvinylphenols may be prepared by block polymerization, emulsion polymerization, or solution polymerization of the corresponding monomers in the presence of a cationic catalyst such as boron trifluoride etherate. Procedures for the formation of such polymers are well known in the art. The naphthol polymer may be blended with the polyvinylphenol resin using procedures described above with respect to the formation of blends of a naphthol polymer and a novolac resin.

In an addition to the above, blends can be formulated of the naphthol polymer and a mixture of the novolac resin and the vinylphenol resin. Procedures for the formation of such a mixture would be substantially the same as the procedure adopted for the mixing of the naphthol polymer with either of the two resins alone.

The ratio of the naphthol polymer to other alkali soluble polymer resin additives comprising the binder, such as the novolac resin or the vinylphenol resin or a mixture of the two, is dependent upon the desired properties of the final photoresist composition. In general, the higher the naphthol content, the higher will be the melt temperature of the photoresist. However, offsetting the desired property of high temperature resistance is a tendency for the resist to be brittle and somewhat difficult to develop at the higher naphthol content. Therefore, though the binder can consist solely of a homopolymer of a naphthol, it is preferred that the naphtol content of the naphthol blend comprise at least 1 mole percent of the blend, more preferably, vary from 5 to 50 mole percent of the blend and most preferably, vary from about 8 to 35 percent of the blend with the balance comprising the alkali soluble resin such as the novolak resin, the polyvinyl phenol resin or a mixture of the two, alone or in combination with other additives in minor amount for specific purposes.

As described above, the naphthol content of the binder can be derived from a homopolymer of naphthol or a copolymer of naphthol with another aromatic alcohol. Whether added as a homopolmer or as a copolymer, the total naphthol content is preferably within the above-defined limits. Therefore, a resin binder having a 25 percent naphthol content can be prepared from a homopolymer of the naphthol with 75 percent of another resin or as a 50-50 copolymer with 50 percent of another resin. Further, a ternary resin binder can be formulated from a homopolymer of naphthol, a novolak resin and a polyvinyl phenol or a copolymer of naphthol and another phenol mixed with a polyvinyl phenol. Other combinations would be apparent to those skilled in the art.

The light sensitive compound added to the binder of the invention may be any of the various light sensitive compounds known to be suitable as sensitizers in photoresists comprising an alkali soluble polymer binder. Examples of such compounds are described above. The amount of sensitizer used and the manner of preparing the photoresist is in accordance with art recognized procedures. In this respect, dependent upon the specific sensitizer and polymer combination, the sensitizer can vary from about 0.1 to 50 weight percent of the photoresist composition and preferably varies between about 5 and 15 weight percent of the formulation.

The method of using the photoresists of the invention is also in accordance with prior art procedures. The most conventional method comprises forming a film from solution by whirl coating, dipping, spraying, etc. Alternatively, the photoresist can be applied as a dry film in accordance with art recognized procedures. When used as a coating solution, the solution preferably contains from about 5 to 40 percent solids in solution.

In addition to the light sensitive constituent, other constituents such as dyes, softeners and other resins may be used in a mixture with the naphthol binder as is known in the art. A particularly useful class of additives is the polyvinyl ethers such as those disclosed in U.S. Pat. No. 3,634,082 incorporated herein by reference. These polymers may be added in amounts varying from 1 to 10 percent by weight of the resist. The preferred polyvinyl ether is polyvinyl methyl ether.

The photoresist compositions of this invention are applied to conventional substrates in conventional manner. For example, the photoresist may be applied to a copper clad substrate, a semiconductor, a silicon wafer, etc. by any of whirl coating, spraying, dipping or the like. Thereafter, the substrate is dried, imaged and developed by washing with an aqueous alkaline developer. Clean development is obtained unless the naphthol content of the binder is excessive, in which case, a developer must be used in more concentrated form than is conventional for similar photoresists. The following examples illustrate the preparation of photoresists in accordance with the invention.

EXAMPLE 5

Two photoresist formulations were prepared with compositions as follows:

| | |
|---|---|
| A. Naphthol Resist | |
| Resin of Example 1 | 16 grams |
| Sensitizer[1] | 1 gram |
| Methyl Cellosolve Acetate | 8 grams |
| B. Novolak Resist | |
| Novolak Resin[2] | 16 grams |
| Sensitizer[1] | 1 gram |
| Methyl Cellosolve Acetate | 8 grams |

[1]Cumyl phenol ester of 1,2-naphthoquinone diazide-(2)-4-sulfonic acid
[2]Acid catalyzed condensation product of m- and p-cresol with formaldehyde Chrome parts were coated with each of the above photoresists by spin coating at 3000 RPM. The coatings obtained varied in thickness form 0.65 to 0.87 microns. All parts were exposed under standard conditions for 50 seconds and developed with a conventional developer for positive photoresist identified as AZ-1351 available from Shipley Company Inc. All parts have good image resolution. All parts were then baked for 30 minutes at varying temperatures and examined the image distortion with the following results obtained:

| Temperature | Novolak Resist | Naphthol Resist |
|---|---|---|
| 120° C. | Distortion | No distortion |
| 140° C. | Distortion | No distortion |
| 150° C. | Distortion | Minor flowing |

The naphthol resist above constitutes the preferred embodiment of the invention.

EXAMPLE 6

Two photoresist formulations were prepared with compositions as follows:

| A. Naphthol Resist | |
|---|---|
| Resin of Example 2 | 24.9 grams |
| Novolak Resin[1] | 10.5 grams |
| Sensitizer[2] | 2.5 grams |
| Diglyme | 9.5 grams |
| Methyl Cellosolve Acetate | 3.0 grams |
| B. Novolak Resist | |
| Novolak Resin[1] | 35.5 grams |
| Sensitizer[2] | 2.5 grams |
| Diglyme | 9.5 grams |
| Methyl Cellosolve Acetate | 3.0 grams |

[1] Acid catalyzed condensation product of o-cresol with formaldehyde.
[2] p-phenyl phenol ester 1,2-naphthoquinone diazide-(2)-4-sulfonic acid The above two photoresists were spun onto glass substrates at 5000 RPM and dried to yield coatings having a thickness varying between 1.25 and 1.60 microns. The resist coatings were exposed through a master for 1 minute and developed with the aforementioned AZ developer diluted with an equal volume of water. The parts with the resist coatings were subjected to heat treatment by baking for 30 minutes at varying termperatures with the following results obtained.

| Temperature | Novolak Resist | Naphthol Resist |
|---|---|---|
| 120° C. | Distortion | No distortion |
| 140° C. | Distortion | No distortion |
| 150° C. | Distortion | Minor flowing |

EXAMPLE 7

The photoresist of Example 5 using a naphthol resin could be reformulated substituting the blend of Example 4 for the naphthol resin of Example 1 in equivalent amount with similar results.

EXAMPLE 8

The photoresist of Example 5 using a naphthol resin could be reformulated substituting the resin blend of Example 3 for the naphthol resin of Example 1 in equivalent amount to produce a developed photoresist image that does not heat distort at temperatures in excess of 150° C.

EXAMPLE 9

The photoresist of Example 5 using a naphthol resin may be reformulated substituting a p-vinyl phenol homopolymer for the Novolak resin in equivalent amount to produce a developed photoresist image that would not heat distort at temperarures in excess of 140° C.

EXAMPLE 10

The photoresist of Example 6 using a naphthol resin may be reformulated substituting 5.25 grams of an p-vinyl phenol homopolymer for one-half of the Novolak resin to produce a developed photoresist image that would not heat distort at temperatures in excess of 140° C.

We claim:

1. A photoresist composition comprising an admixture of a binder and a sensitizer, said binder being an alkali soluble naphthol polymer that is the product of condensation of an aldehyde and a mixed monomer consisting of a naphthol and a phenol, the binder having a naphthol content of at least 1 mole percent, and said sensitizer comprising a binder compatible and developable sensitizer selected from the group of positive working o-quinone diazide compounds and negative working azide compounds, said sensitizer being present in an amount of from 0.1 to 50 weight percent of the photoresist composition.

2. The photoresist composition of claim 1 where the sensitizer is an o-quinone diazide sulfonic acid ester or amide.

3. The photoresist composition of claim 2 where the naphthol polymer is a copolymer of a naphthol compound of the formula:

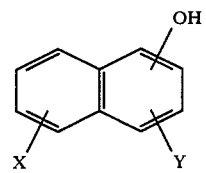

where X and Y are each members selected from the group of hydrogen, lower alkyl having from 1 to 4 carbon atoms, halogen, hydroxyl and carboxyl; and another aromatic phenol.

4. The photoresist of claim 3 where the other aromatic phenol is selected from the group of phenol, m-cresol, p-cresol, o-cresol, 2,4-xylenol, 2,5-xylenol, 3,4-xylenol, thymol, carvacrol, p-phenylphenol, p-tert-butyl phenol and mixtures thereof.

5. The photoresist composition of claim 2 where the naphthol binder is a copolymer of naphthol and a cresol.

6. The photoresist composition of claim 3 where the naphthol content varies between 5 and 50 mole percent of the binder.

7. The photoresist composition of claim 6 where the naphthol content varies between 8 and 35 mole percent of the binder.

8. The photoresist ot claim 7 containing a polyvinyl ether in the resist binder in an amount of up to 10% by weight of the binder.

9. The photoresist of claim 7 where the polyvinyl ether is a polyvinyl methyl ether.

10. The photoresist composition of claims 1, 3 or 6 as a liquid coating composition.

11. The photoresist composition of claims 1, 3 or 6 as a dry film.

12. A photoresist composition comprising an admixture of a binder and a sensitizer, said binder being an alkali soluble admixture of an alkali soluble naphthol polymer and an alkali soluble polymer, said naphthol polymer consisting of the condensation product of an aldehyde and naphthol in combination with a phenol, said alkali soluble polymer being selected from the group of novolak resins and polyvinyl phenols, said binder having a naphthol content of at least 1 mole percent, and said sensitizer being a binder compatible and developable sensitizer selected from the group of positive working o-quinone diazide compounds and negative working azide compounds, said sensitizer being present in an amount of from 0.1 to 50 weight percent of the photoresist composition.

13. The photoresist composition of claim 12 where the sensitizer is an o-quinone diazide sulfonic acid ester or amide.

14. The photoresist composition of claim 12 where the naphthol polymer is a compolymer of a naphthol compound of the formula:

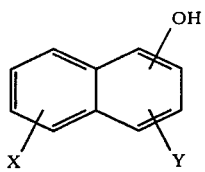

where X and Y are each members selected from the group of hydrogen, lower alkyl having from 1 to 4 carbon atoms, halogen, hydroxyl and carboxyl; and another aromatic phenol.

15. The photoresist of claim 14 where the other aromatic phenol is selected from the group of phenol, m-cresol, p-cresol, o-cresol, 2,4-xylenol, 2,5-xylenol, 3,4-xylenol, thymol, carvacrol, p-phenylphenol, p-tert-butyl phenol and mixtures thereof.

16. The photoresist composition of claim 12 where the naphthol binder is a copolymer of naphthol and a cresol.

17. The photoresist composition of claim 12 where the naphthol content varies between 5 and 50 mole percent of the binder.

18. The photoresist composition of claim 13 where the naphthol content varies between 8 and 35 mole percent of the binder.

19. The photoresist of claim 18 containing a polyvinyl ether in the resist binder in an amount of up to 10% by weight of the binder.

20. The photoresist of claim 19 where the polyvinyl ether is a polyvinyl methyl ether.

21. The photoresist composition of claims 12 or 13 as a liquid coating composition.

22. The photoresist composition of claims 12 or 13 as a dry film.

* * * * *

UNITED STATES PATENT AND TRADEMARK OFFICE
CERTIFICATE OF CORRECTION

PATENT NO. : 4,551,409
DATED : Nov. 5, 1985
INVENTOR(S) : Michael Gulla et al

It is certified that error appears in the above-identified patent and that said Letters Patent is hereby corrected as shown below:

The term of this patent subsequent to Sept. 13, 2000 has been disclaimed.

Signed and Sealed this

First Day of July 1986

[SEAL]

Attest:

DONALD J. QUIGG

Attesting Officer

Commissioner of Patents and Trademarks